(12) United States Patent
Johnston

(10) Patent No.: US 7,215,267 B1
(45) Date of Patent: May 8, 2007

(54) ANALOG-TO-DIGITAL CONVERTER WITH DITHER CONTROL

(75) Inventor: Jerome E. Johnston, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/311,611

(22) Filed: Dec. 19, 2005

(51) Int. Cl.
*H03M 1/20* (2006.01)

(52) U.S. Cl. .............. 341/131; 341/143; 341/155

(58) Field of Classification Search .......... 341/131, 341/143, 155, 118, 120
See application file for complete search history.

(56) References Cited

U.S. PATENT DOCUMENTS

| 4,968,987 | A  | * | 11/1990 | Naka et al. ............. 341/143 |
| 5,144,308 | A  | * | 9/1992  | Norsworthy ............. 341/131 |
| 5,835,038 | A  | * | 11/1998 | Nakao et al. ........... 341/131 |
| 6,016,113 | A  | * | 1/2000  | Binder ................... 341/131 |
| 6,175,321 | B1 | * | 1/2001  | Frannhagen et al. ..... 341/143 |
| 6,326,911 | B1 | * | 12/2001 | Gomez et al. ........... 341/143 |
| 6,351,229 | B1 | * | 2/2002  | Wang ..................... 341/143 |
| 6,577,257 | B2 | * | 6/2003  | Brooks .................. 341/131 |
| 6,738,022 | B2 | * | 5/2004  | Klaavo et al. .......... 343/700 MS |
| 6,812,876 | B1 | * | 11/2004 | Miller ................... 341/143 |
| 6,919,832 | B2 | * | 7/2005  | Brooks .................. 341/143 |
| 6,980,145 | B1 | * | 12/2005 | Tammineedi ............ 341/143 |

OTHER PUBLICATIONS

S. P. Lipshitz, R. A. Wannmaker and J. Vanderkooy, "Quantization and Dither: A Theoretical Survey", J. Audio Eng. Soc., vol. 40, No. 5, pp. 355-374, May 1992.

* cited by examiner

*Primary Examiner*—Linh Nguyen
(74) *Attorney, Agent, or Firm*—Davis Chin; Steven Lin; Gregory S. Thomas

(57) ABSTRACT

An analog-to-digital converter system comprises an analog-to-digital converter and a dither generator. The analog-to-digital converter receives an analog input signal and generates a digital signal that is proportional to the analog input signal. The output of the analog-to-digital converter is dominated by quantization error. The dither generator is responsive to a user-controlled input for generating an output signal. An adder sums the digital signal from the analog-to-digital converter with the output signal from the dither generator to provide a summed signal. The summed signal is either dominated by quantization noise or is properly dithered depending upon the user-controlled input.

11 Claims, 2 Drawing Sheets

ANALOG-TO-DIGITAL CONVERTER WITH DITHER CONTROL

CROSS-REFERENCE TO RELATED APPLICATIONS

This application is related to co-pending U.S. patent application Ser. No. 10/346,532 filed on Jan. 17, 2003 and entitled "Method and Apparatus for Automatic Word Length Conversion".

BACKGROUND OF THE INVENTION

1. Field of the Invention

This invention relates generally to analog-to-digital converters and more particularly, it relates to an analog-to-digital converter system with dither control which allows a user to selectively add dither to the converter system output codes dependent upon the particular application.

2. Description of the Prior Art

As is generally well known in the field of digital processing applications, an analog-to-digital converter (ADC) is used to perform the conversion of an analog signal to a digital signal. In recent years, there has been a significant increase in the use of analog-to-digital converters in the audio applications as well as in the instrumentation applications. Typically, analog-to-digital converters include circuitry for receiving an analog input signal and for generating a digital output signal which is proportional to the analog input signal.

One type of analog-to-digital converter that has been used quite frequently in the past few years is one that uses delta-sigma modulation in which an analog voltage is applied to the input of a delta-sigma modulator and its output thereof is filtered so as to remove modulator quantization noise. The delta-sigma A/D converter is basically formed of an analog modulator and a digital filter. The analog modulator oversamples the analog input signal and produces a low-resolution digital output signal, which is then processed by the digital filter to remove the modulator quantization noise. The output of the digital filter is a digital word which has its own inherent quantization noise.

Accordingly, there are known prior art techniques for reducing the effects of quantization error, whether it is produced by an analog modulator or it is the result of output word quantization, by adding a small amount of noise, referred to also as dither, to the converter system. For example, there is described in the aforementioned application, U.S. Ser. No. 10/346,532, a method and apparatus for automatically converting a word length of sample data being transmitted over a serial link. Based upon the desired word length, the sample data is either truncated or padded and an appropriate amount of dither is added to the sample words to reduce the distortion and quantization artifacts introduced by the word length conversion. This U.S. application Ser. No. 10/346,532 is assigned to the same assignee as the present invention and is hereby incorporated by reference in its entirety.

In addition, there is disclosed in U.S. Pat. No. 6,356,872 to Ka Yin Leung et al. a digital audio system for storing digital audio data on a digital audio media and retrieving the stored digital audio data in a playback operation which includes a noise shaping device for adding dither to an input signal prior to truncation. Further, for a discussion of the differences between different types of dithered quantization schemes and the various dither signals utilized in practical applications, reference is made to the publication by S. P. Lipschitz, R. A. Wannmaker and J. Vanderkooy, "Quantization and Dither: A Theoretical Survey", *J. Audio Eng. Soc.*, Vol. 40, No. 5, pp. 355–374, May 1992 (hereafter "the Lipschitz et al., paper").

In the prior art discussed above, there are described ways of how the error effects of quantization can be removed by adding the proper amount of dither, i.e., quantization error dithered by noise. Dithering has particular applications such as in the case of averaging output conversion words so as to improve resolution or performing digital signal processing or sampling of very small AC signals since the quantization error would introduce effects which could be detrimental to the desired results. The use of dither with proper statistical properties can render the total error to be equivalent to a steady white noise (See p. 356 of the Lipschitz et al., paper). However, it is not always desirable to have the quantization error at the converter output be dithered.

Specifically, in instrumentation applications such as measuring a "dc" signal with only one conversion being performed and where the thermal noise of the analog-to-digital converter is only a fraction of a least significant bit (LSB), it would then be desirable to have the converter output codes dominated by quantization error instead of being properly dithered since it would yield the highest resolution for the measurement. For example, a theoretical 16-bit A/D converter is assumed to have thermal noise equal to the value of LSB/20. When such an ADC is used to perform a measurement on a dc signal and where only a single conversion is being performed, the maximum output code toggle that can occur would be two (2) codes. In this case, the ADC can produce up to 32,767 "noise-free" codes in its transfer function.

In view of this, it would be desirable to provide an analog-to-digital converter system with dither control which allows a user to selectively add dither to the converter output codes dependent upon the particular application. It would also be expedient that the analog-to-digital converter system include a pin input or a register control bit which is readily accessible by the user for controlling the converter system output to be dominated by quantization error or to be properly dithered.

SUMMARY OF THE INVENTION

Accordingly, it is a general object of the present invention to provide an improved analog-to-digital converter system with dither control which has been traditionally unavailable.

It is an object of the present invention to provide an improved analog-to-digital converter system with dither control which is relatively simple in its construction and operation.

It is another object of the present invention to provide an analog-to-digital converter system with dither control which allows a user to selectively add dither to the converter output codes dependent upon the particular application.

It is still another object of the present invention to provide an analog-to-digital converter system which is formed of an analog-to-digital converter and a dither generator so as to provide a summed signal either dominated by quantization error or is properly dithered dependent upon a user-controlled input.

In one preferred embodiment of the present invention, there is provided an analog-to-digital converter system which is formed of an analog-to-digital converter and a dither generator. The analog-to-digital converter is preferably a delta-sigma analog-to-digital converter consisting of a delta-sigma modulator and digital filter. The delta-sigma modulator receives an analog input signal and generates a digital signal that is proportional to the analog input signal. The digital filter is coupled to the output of the delta-sigma modulator for filtering out modulator quantization noise. This results in a digital output word with its own quantization error.

The dither generator is responsive to a user-controlled input for generating an output signal. An adder sums the filtered digital signal from the digital filter with the output signal from the dither generator to provide a summed signal. The summed signal is either dominated by quantization error or is properly dithered dependent upon the user-controlled input.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
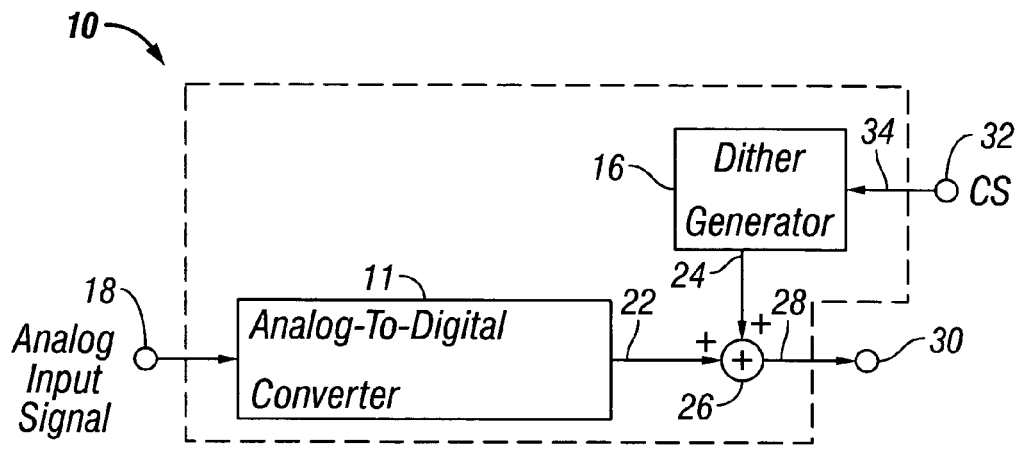
FIG. 1 is a block diagram of an analog-to-digital converter system with dither control, constructed in accordance with the principles of the present invention.

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

With reference now in detail to the drawings, there is illustrated in FIG. 1 an improved analog-to-digital converter (ADC) system 10, constructed in accordance with the principles of the present invention. The ADC system 10 comprises an analog-to-digital converter 11 and a dither generator 16. The analog-to-digital converter 11 is operable to receive an analog signal on its input terminal 18 and converts it to a digital signal having a value that is proportional to the value of the analog input signal. This digital signal on the line 22 defines output codes of the analog-to-digital converter 11 which are dominated by quantization error.

In accordance with the present invention, the dither generator 16 provides a dither signal on line 24 which is supplied to an adder or summer 26 so as to be summed with the digital signal dominated with quantization error on the line 22. The resulting sum signal on the line 28 is delivered to an output terminal 30 defining the converter system output. The dither generator 16 is used only to compensate for the error effects of quantization for applications that average conversion words to improve resolution or for applications that digitize low level AC signals.

In other words, the dither generator is not used for applications that perform one conversion on a "dc" signal. To this end, the dither generator is made to be user-controlled so that the dither signal is capable of being turned on and off. In this manner, the converter system output at the output terminal 30 can be optimized dependent upon the particular application.

In operation, the dither generator 16 is selectively turned on and off by the user via an external dither control signal CS. The control signal CS is inputted to an input pin 32 exterior of the ADC system to the dither generator via a line 34. When the user desire to activate the dither generator by applying the control signal CS to the input pin 32, the dither signal on the line 24 will be automatically summed with the digital signal on the line 22 in order to produce the resulting sum signal which is properly dithered.

On the other hand, when the user decides to deactivate the dither generator by not applying the control signal CS to the input pin 32, no dither signal will appear on the line 24. Consequently, the resulting sum signal will be the same as the digital signal from the analog-to-digital converter 11 which is dominated by quantization error.

Figure 2:
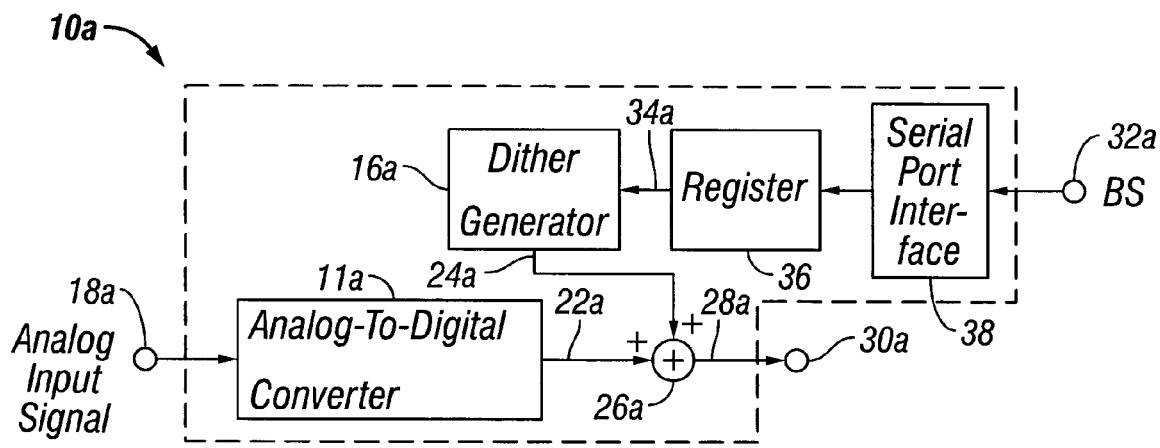
FIG. 2 is a block diagram of a second embodiment of an analog-to-digital converter system with dither control in accordance with the present invention.

In FIG. 2, there is shown a block diagram of a second embodiment of an analog-to-digital converter system 10a of the present invention. The ADC system 10a is substantially identical to the ADC system 10 of FIG. 1, except that the dither generator is activated by a control bit of a register via a serial port interface rather than by the control signal CS.

In particular, as can be seen from FIG. 2, the ADC system 10a comprises an analog-to-digital converter 11a and a dither generator 16a. The analog-to-digital converter 11a is operable to receive an analog signal on its input terminal 18a and converts it to a digital signal having a value that is proportional to the value of the analog input signal. This digital signal on line 22a defines output codes of the analog-to-digital converter 11a which are dominated by quantization error.

In accordance with the second embodiment of the present invention, the dither generator 16a provides a dither signal on line 24a which is supplied to an adder or summer 26a so as to be summed with the digital signal dominated with quantization error on the line 22a. The resulting sum signal on the line 28a is delivered to an output terminal 30a defining the converter system output. The dither generator 16a is used only to compensate for the error effects of quantization for applications that average conversion words to improve resolution or for applications that digitize low level AC signals.

In other words, the dither generator is not used for applications that perform one conversion on a "dc" signal. To this end, the dither generator is made to be user-controlled so that the dither signal is capable of being turned on and off. In this manner, the converter system output at the output terminal 30a can be optimized dependent upon the particular application.

As thus far described, the construction of the ADC system 10a of FIG. 2 is identical to the ADC system 10. Unlike the converter of FIG. 1, the ADC system 10a further includes a register 36 and a serial port interface 38 having its input connected to receive an external control signal BS on input pin 32a. The output of the register 36 is on line 34a which provides a bit control signal.

In operation, the dither generator 16a is selectively turned on and off by the user via the external control signal BS. The external control signal BS is inputted to the input pin 32a exterior of the ADC system to the dither generator via the serial port interface 38 and a line 34a from the output of register 36. When the user desires to activate the dither generator by applying the external control signal BS to the input pin 32a so as to cause the bit control signal to go high or logic "1", the dither signal on the line 24a will be automatically summed with the digital signal on the line 22a in order to produce once again the resulting sum signal which is properly dithered.

On the other hand, when the user decides to deactivate the dither generator by not applying the external control signal BS to the input pin 32a so that the bit control signal will remain low or logic "0", no dither signal will appear on the line 24a. Consequently, the resulting sum signal will be the same as the digital signal from the analog-to-digital converter 11a which is dominated by quantization error.

Figure 3:
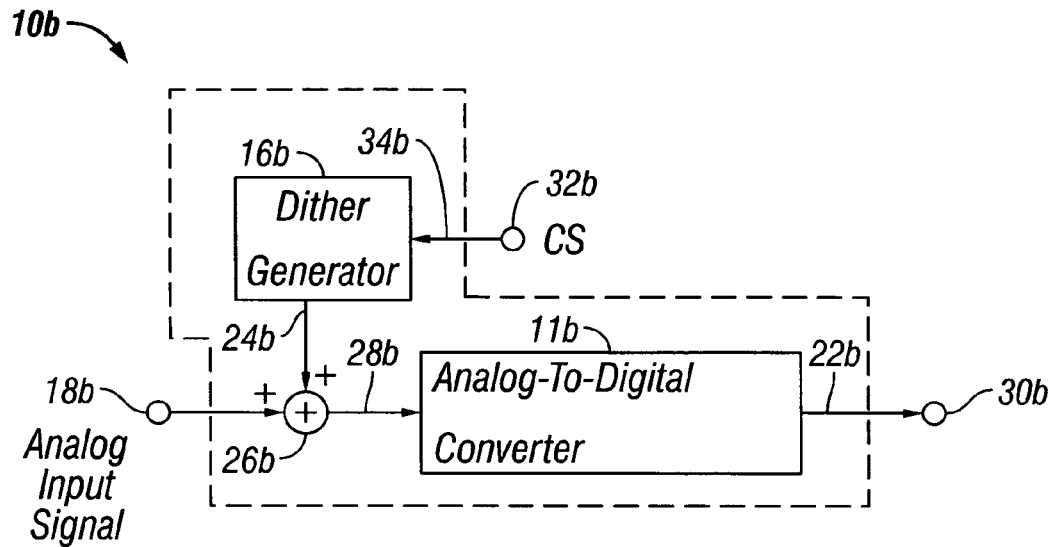
FIG. 3 is a block diagram of a third embodiment of an analog-to-digital converter system with dither control in accordance with the present invention.

In FIG. 3, there is illustrated a third embodiment of an analog-to-digital converter system 10b which is substantially identical to the converter system 10 of FIG. 1, except that the dither generator 16b and summer 26b are added to the input of the analog-to-digital converter 11b rather than to the output of the analog-to-digital converter 11. The dither generator 16b provides a dither signal on line 24b which is supplied to the adder or summer 26b so as to be summed with the analog signal on the input terminal 18b. The resulting sum signal on line 28b is delivered to the input of the analog-to-digital converter 11b. The output of analog-to-digital converter 11b on line 22b is fed to the output terminal 30b. Except for these differences, the construction and operation of the ADC system 10b is identical to the ADC system 10 of FIG. 1. Therefore, a detailed description of its components and their interconnections and operation will not be repeated.

Figure 4:
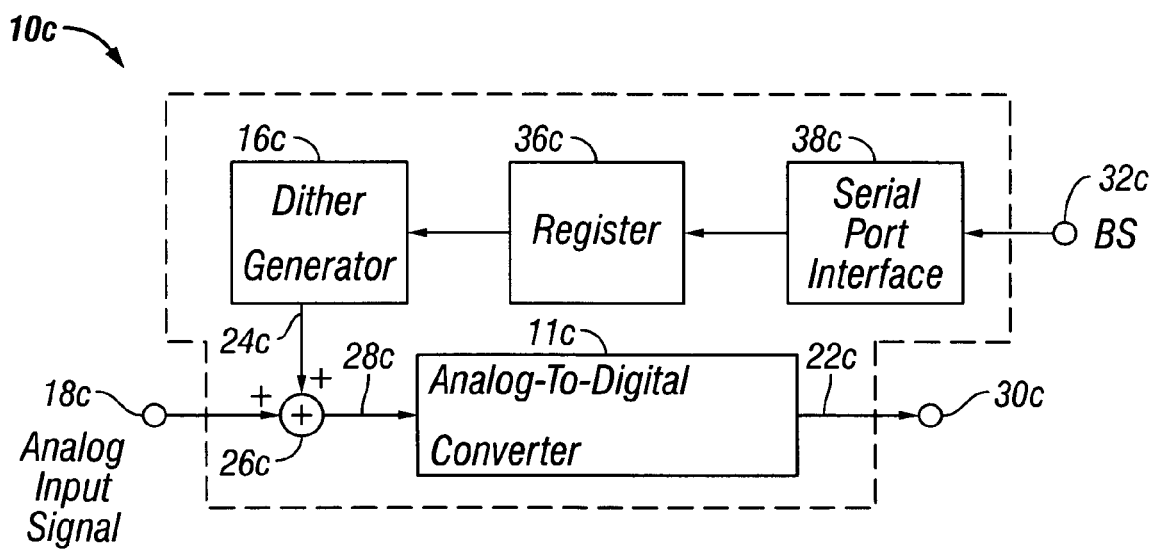
FIG. 4 is a block diagram of a fourth embodiment of an analog-to-digital converter system with dither control in accordance with the present invention.

In FIG. 4, there is illustrated a fourth embodiment of an analog-to-digital converter 10c which is substantially identical to the converter 10a of FIG. 2, except that the serial port interface 38c, register 36c, dither generator 16c and summer 26c are added to the input of the analog-to-digital converter 11c rather than to the output of the analog-to-digital converter 11a. The dither generator 16c provides a dither signal on line 24c which is supplied to the adder or summer 26c so as to be summed with the analog signal on the input terminal 18c. The resulting sum signal on line 28c is delivered to the input of the analog-to-digital converter 11c. The output of analog-to-digital converter 11c on line 22c is fed to the output terminal 30c. Except for these differences, the construction and operation of the ADC 10d is identical to the ADC 10a of FIG. 2. Therefore, a detailed description of its components and their interconnections and operation will not be repeated again.

Figure 5:
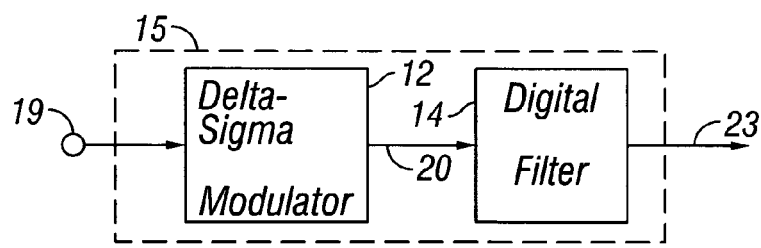
FIG. 5 is block diagram of a delta-sigma analog-to-digital converter for use in the analog-to-digital converters 11–11c in FIGS. 1 through 4.

In FIG. 5, there is illustrated a block diagram of a delta-sigma analog-to-digital converter 15 for use in the analog-to-digital converters 11–11c in the respective FIGS. 1 through 4. As can be seen, the delta-sigma analog-to-digital converter 15 consist of a delta-sigma modulator 12 and a digital filter 14. The delta-sigma modulator 12 is operable to receive an analog signal on its input terminal 19 and converts it to a digital signal having a value that is proportional to the value of the analog input signal.

The delta-sigma modulator has a predetermined sample rate which has inherent noise, such as quantization noise or quantization error, associated therewith. The output of the delta-sigma modulator 12 on line 20 is fed to the input of the digital filter 14. The digital filter functions to filter this modulator quantization noise so as to produce a filtered digital signal on line 23. This filtered digital signal is dominated by quantization error of the output word. It should also be understood by those skilled in the art that the analog-to-digital converters 11–11c may be formed in the alternative as a successive approximation register.

From the foregoing detailed description, it can thus be seen that the present invention provides an improved analog-to-digital converter system with dither control which allows a user to selectively add dither to the converter system output codes dependent upon the particular application. The analog-to-digital converter system includes a pin input or a register control bit which is readily accessible by the user for controlling the converter output to be dominated by quantization error or to be properly dithered.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. An analog-to-digital converter system comprising:
   an analog-to-digital converter for receiving an analog input signal and for generating a digital signal on its output;
   the output of said analog-to-digital converter being dominated by quantization error;
   dither generator responsive to a user-controlled input signal for controlling said dither generator so as to generate an output signal;
   a summer for summing said digital signal from said analog-to-digital converter with said output signal from said dither generator and for providing a summed signal;
   said user-controlled input signal being applied to an input pin for selectively inputting a dither control signal to said dither generator;
   said summed signal not being dominated by quantization error when the dither control signal is not activated and said summed signal being properly dithered when the dither control signal is activated; and
   said dither control signal being applied to a register via the input pin and a serial port interface externally of the converter system.

2. An analog-to-digital converter system as claimed in claim 1, wherein said analog-to-digital converter is a delta-sigma analog-to-digital converter which consists of a delta-sigma modulator and a digital filter.

3. An analog-to-digital converter system as claimed in claim 1, wherein said summer is an adder.

4. An analog-to-digital converter system, comprising:
   an analog-to-digital converter for receiving a summed signal and for generating a digital signal;
   the output of said analog-to-digital converter being dominated by quantization error;
   dither generator responsive to a user-controlled input signal for controlling said dither generator so as to generate an output signal;
   a summer for summing an analog input signal with said output signal from said dither generator and for providing the summed signal;

said user-controlled input signal being applied to an input pin for selectively inputting a dither control signal to said dither generator;

said summed signal not being dithered when the dither control signal is not activated and said summed signal being dithered when the dither control signal is activated; and said dither control signal being applied to a register via the input pin and a serial port interface externally of the converter system.

5. An analog-to-digital converter system as claimed in claim 4, wherein said analog-to-digital converter is a delta-sigma analog-to-digital converter which comprises a delta-sigma modulator and a digital filter.

6. An analog-to-digital converter system as claimed in claim 4, wherein said summer is an adder.

7. A method for converting an analog input signal to a digital signal, comprising:

receiving the analog input signal at the input of an analog-to-digital converter to generate the digital signal on its output;

the digital signal on the output of the analog-to-digital converter being dominated by quantization error;

generating an output signal from a dither generator in response to a user-controlled input signal;

summing the digital signal from the analog-to-digital converter with the output signal from the dither generator to provide a summed signal; and applying the user-controlled input signal to a register responsive to a control signal via an input pin and a serial port interface for selectively inputting a bit control signal to the dither generator.

8. An analog-to-digital converter system comprising:

an analog-to-digital converter for receiving an analog input signal and for generating a digital signal on its output;

the output of said analog-to-digital converter being dominated by quantization error;

dither generator responsive to a user-controlled input signal for controlling said dither generator so as to generate an output signal;

a summer for summing said digital signal from said analog-to-digital converter with said output signal from said dither generator and for providing a summed signal; and said user-controlled input signal being applied to a register responsive to a control signal via an input pin and a serial port interface for selectively inputting a bit control signal to said dither generator.

9. An analog-to-digital converter system as claimed in claim 8, wherein said summed signal is not dominated by quantization error when the bit control signal is not activated and said summed signal is properly dithered when the bit control signal is activated.

10. An analog-to-digital converter system, comprising:

an analog-to-digital converter for receiving a summed signal and for generating a digital signal;

the output of said analog-to-digital converter being dominated by quantization error;

dither generator responsive to a user-controlled input signal for controlling said dither generator so as to generate an output signal;

a summer for summing an analog input signal with said output signal from said dither generator and for providing the summed signal;

said user-controlled input signal being applied to a register responsive to a control signal via an input pin and a serial port interface for selectively inputting a bit control signal to said dither generator.

11. An analog-to-digital converter system as claimed in claim 10, wherein said summed signal is not dithered when the bit control signal is not activated and said summed signal is dithered when the bit control signal is activated.

* * * * *